United States Patent
Wu et al.

(10) Patent No.: US 10,978,652 B2
(45) Date of Patent: Apr. 13, 2021

(54) DISPLAY PANEL AND METHOD FOR MANUFACTURING SAME

(71) Applicant: WUHAN CHINA STAR OPTOELECTRONICS SEMICONDUCTOR DISPLAY TECHNOLOGY CO., LTD., Hubei (CN)

(72) Inventors: Kerong Wu, Hubei (CN); Seungkyu Choi, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 14 days.

(21) Appl. No.: 16/341,064

(22) PCT Filed: Sep. 21, 2018

(86) PCT No.: PCT/CN2018/107110
§ 371 (c)(1),
(2) Date: Apr. 11, 2019

(87) PCT Pub. No.: WO2020/029390
PCT Pub. Date: Feb. 13, 2020

(65) Prior Publication Data
US 2020/0161571 A1 May 21, 2020

(30) Foreign Application Priority Data
Aug. 10, 2018 (CN) .......................... 201810906148.X

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3246* (2013.01); *H01L 27/3248* (2013.01);
(Continued)

(58) Field of Classification Search
CPC ............. H01L 27/1218; H01L 27/1248; H01L 27/1259; H01L 27/3246; H01L 27/3248;
(Continued)

(56) References Cited

U.S. PATENT DOCUMENTS

2015/0036269 A1* 2/2015 Kim .................... H01L 51/0097
361/679.01
2017/0047546 A1* 2/2017 Choi .................... H01L 51/0097
(Continued)

FOREIGN PATENT DOCUMENTS

CN 106601776 A 4/2017
CN 107004617 A 8/2017
(Continued)

*Primary Examiner* — Joseph M Galvin, III
(74) *Attorney, Agent, or Firm* — Mark M. Friedman

(57) ABSTRACT

A display panel and a method for manufacturing same are provided. The display panel includes a flexible film layer, a thin film transistor switching device, an insulation layer, a planarization layer, an organic light-emitting diode display device, and a package layer. A part of the planarization layer fills a first through-hole of the insulation layer. A first metal component and a second metal component of the display panel are disposed on two sides of the first through-hole, and a third metal component of the display panel is connected to the first metal component and the second metal component, so as to improve a bending capability of the display panel.

20 Claims, 7 Drawing Sheets

(51) Int. Cl.
　　　*H01L 51/52*　　　(2006.01)
　　　*H01L 51/56*　　　(2006.01)
　　　*H01L 27/12*　　　(2006.01)

(52) U.S. Cl.
　　　CPC ...... *H01L 27/3258* (2013.01); *H01L 51/5253* (2013.01); *H01L 51/56* (2013.01); *H01L 27/1218* (2013.01); *H01L 27/1248* (2013.01); *H01L 27/1259* (2013.01); *H01L 2227/323* (2013.01); *H01L 2251/5338* (2013.01)

(58) Field of Classification Search
　　　CPC ............. H01L 27/3258; H01L 51/0097; H01L 51/5253; H01L 51/56
　　　See application file for complete search history.

(56) References Cited

U.S. PATENT DOCUMENTS

| | | |
|---|---|---|
| 2017/0308212 A1 | 10/2017 | Jin et al. |
| 2018/0145125 A1* | 5/2018 | Lee .................... H01L 27/3262 |
| 2018/0226458 A1* | 8/2018 | Bai .................... H01L 27/3246 |
| 2018/0233552 A1 | 8/2018 | Lee et al. |
| 2019/0095007 A1* | 3/2019 | Jeong .................. G06F 3/0446 |
| 2019/0148474 A1 | 5/2019 | Bu |
| 2019/0164998 A1* | 5/2019 | Cho .................... H01L 27/1225 |

FOREIGN PATENT DOCUMENTS

| | | |
|---|---|---|
| CN | 107146810 A | 9/2017 |
| CN | 107393942 A | 11/2017 |
| CN | 107994055 A | 5/2018 |

* cited by examiner

DISPLAY PANEL AND METHOD FOR MANUFACTURING SAME

BACKGROUND

Technical Field

The present disclosure relates to the field of display technologies, and in particular, to a display panel and a method for manufacturing same.

Related Art

A conventional display panel is generally provided with a display area and a bending area, and the conventional display panel is bent at the bending area.

Several film layers are generally disposed in the conventional display panel, where some film layers are made of an inorganic material. The film layer made of the inorganic material has a relatively poor flexibility. When the conventional display panel is bent, the film layer made of the inorganic material is easily broken, which affects quality and service life of the display panel.

Therefore, it is necessary to propose a new technical solution, so as to resolve the foregoing technical problem.

SUMMARY

An objective of the present disclosure is to provide a display panel and a method for manufacturing same, to improve a bending capability of the display panel.

To resolve the foregoing problem, technical solutions of the present disclosure are as follows:

A display panel is provided, where the display panel has a display area and a bending area, and the display panel includes: a flexible film layer; a thin film transistor switching device; an insulation layer, where a part of the insulation layer located at the bending area is provided with a first through-hole, and the first through-hole runs through the insulation layer; a planarization layer, where a part of the planarization layer located at the bending area fills the first through-hole; an organic light-emitting diode display device, where the organic light-emitting diode display device is disposed on the planarization layer partially located at the display area; and a package layer, where the display panel further includes a first metal component, a second metal component, and a third metal component that are located at the bending area, the first metal component and the second metal component are disposed on the insulation layer located at the bending area, and the third metal component is connected to the first metal component and the second metal component using a second through-hole and a third through-hole; the display panel further includes a first buffer layer, and the first buffer layer is disposed on the flexible film layer; the first through-hole further runs through the first buffer layer, and a bottom of the first through-hole extends onto the flexible film layer or into the flexible film layer; the third metal component is disposed on the part of the planarization layer located at the bending area, and a location of the third metal component corresponds to a location of the first through-hole; and the first metal component and the second metal component are respectively located at locations corresponding to two sides of an opening position of the first through-hole.

In the foregoing display panel, the flexible film layer includes a first film sublayer, a second buffer layer, and a second film sublayer, and the second buffer layer is disposed between the first film sublayer and the second film sublayer; and the first through-hole further runs through the second film sublayer, or the first through-hole further runs through the second film sublayer and the second buffer layer.

A display panel is provided, where the display panel has a display area and a bending area, and the display panel includes: a flexible film layer; a thin film transistor switching device; an insulation layer, where a part of the insulation layer located at the bending area is provided with a first through-hole, and the first through-hole runs through the insulation layer; a planarization layer, where a part of the planarization layer located at the bending area fills the first through-hole; an organic light-emitting diode display device, where the organic light-emitting diode display device is disposed on the planarization layer partially located at the display area; and a package layer, where the display panel further includes a first metal component, a second metal component, and a third metal component that are located at the bending area, the first metal component and the second metal component are disposed on the insulation layer located at the bending area, and the third metal component is connected to the first metal component and the second metal component using a second through-hole and a third through-hole.

In the foregoing display panel, the display panel further includes a first buffer layer, and the first buffer layer is disposed on the flexible film layer; and the first through-hole further runs through the first buffer layer, and a bottom of the first through-hole extends onto the flexible film layer or into the flexible film layer.

In the foregoing display panel, the flexible film layer includes a first film sublayer, a second buffer layer, and a second film sublayer, and the second buffer layer is disposed between the first film sublayer and the second film sublayer; and the first through-hole further runs through the second film sublayer, or the first through-hole further runs through the second film sublayer and the second buffer layer.

In the foregoing display panel, the third metal component is disposed on the part of the planarization layer located at the bending area, and a location of the third metal component corresponds to a location of the first through-hole.

In the foregoing display panel, the display panel further includes a pixel definition layer, a part of the pixel definition layer located at the bending area is disposed on the third metal component and a part of the planarization layer not covered by the third metal component, and the part of the pixel definition layer located at the bending area and the part of the planarization layer located at the bending area are used to prevent the third metal component from being broken in a bending process.

In the foregoing display panel, a structure reinforcement component is disposed on the part of the pixel definition layer located at the bending area, a location of the structure reinforcement component corresponds to a location of the third metal component and/or a location of the first through-hole, and the structure reinforcement component is used to reinforce a structural strength of the display panel at the bending area.

In the foregoing display panel, a plurality of blocking components is disposed on a part of the pixel definition layer located at the display area; and a material of the structure reinforcement component is same as a material of the blocking components.

In the foregoing display panel, the first metal component and the second metal component are respectively located at locations corresponding to two sides of an opening position of the first through-hole; and the second through-hole and the third through-hole run through the planarization layer.

In the foregoing display panel, a part of the insulation layer located at the display area is provided with a fifth through-hole and a sixth through-hole; and a depth of the first through-hole in a direction perpendicular to the display panel is greater than depths of the fifth through-hole and the sixth through-hole in the direction perpendicular to the display panel.

In the foregoing display panel, a part of the display panel located at the bending area is further provided with a first protection plate and a second protection plate, the first protection plate is disposed on a surface of the flexible film layer away from the insulation layer, and the second protection plate is disposed on the structure reinforcement component and a surface of the pixel definition layer that is not covered by the structure reinforcement component.

A method for manufacturing a display panel is provided, where the method for manufacturing a display panel includes the following steps: step A: forming a flexible film layer; step B: disposing a first buffer layer, a semiconductor component, an insulation layer, and a gate on the flexible film layer; step C: providing a first through-hole on a part of the insulation layer located at a bending area of the display panel, and providing a fifth through-hole and a sixth through-hole on a part of the insulation layer located at a display area of the display panel; step D: disposing a source and a drain on the part of the insulation layer located at the display area and in the fifth through-hole and the sixth through-hole, and disposing a first metal component and a second metal component on the part of the insulation layer located at the bending area; step E: disposing a planarization layer on the insulation layer and in the first through-hole; step F: providing a second through-hole, a third through-hole and a fourth through-hole in the planarization layer; step G: disposing a third metal component on a part of the planarization layer located at the bending area and in the second through-hole and the third through-hole, and disposing an anode on a part of the planarization layer located at the display area and in the fourth through-hole; step H: disposing an organic light-emitting material layer and a cathode on the anode; and step I: disposing a package layer on the cathode.

In the foregoing method for manufacturing a display panel, the first through-hole runs through the insulation layer and the first buffer layer, and a bottom of the first through-hole extends into the flexible film layer.

In the foregoing method for manufacturing a display panel, the step A includes: step a1: forming a first film sublayer; step a2: disposing a second buffer layer on the first film sublayer; and step a3: disposing a second film sublayer on the second buffer layer, where the first through-hole further runs through the second film sublayer, or the first through-hole further runs through the second film sublayer and the second buffer layer.

In the foregoing method for manufacturing a display panel, a location of the third metal component corresponds to a location of the first through-hole.

In the foregoing method for manufacturing a display panel, after the step G, the method for manufacturing a display panel further includes the following step: step J: disposing a pixel definition layer on the anode, the third metal component and a part of the planarization layer other than the anode and the third metal component, where a part of the pixel definition layer located at the bending area is disposed on the third metal component and a part of the planarization layer not covered by the third metal component, and the part of the pixel definition layer located at the bending area and the part of the planarization layer located at the bending area are used to prevent the third metal component from being broken in a bending process.

In the foregoing method for manufacturing a display panel, the method for manufacturing a display panel includes the following step: step K: disposing a structure reinforcement component on the part of the pixel definition layer located at the bending area, where a location of the structure reinforcement component corresponds to a location of the third metal component and/or a location of the first through-hole, and the structure reinforcement component is used to reinforce a structural strength of the display panel at the bending area.

In the foregoing method for manufacturing a display panel, the first metal component and the second metal component are respectively located at locations corresponding to two sides of an opening position of the first through-hole; and the second through-hole and the third through-hole run through the planarization layer.

In the foregoing method for manufacturing a display panel, a depth of the first through-hole in a direction perpendicular to the display panel is greater than depths of the fifth through-hole and the sixth through-hole in the direction perpendicular to the display panel.

In the embodiment of the present disclosure, because the bending area of the display panel is provided with the first through-hole running through the insulation layer, and at least one part of the planarization layer fills the first through-hole, the technical solutions of the embodiment of the present disclosure can improve the bending capability of the display panel. Moreover, because the first metal component and the second metal component are respectively disposed on the two sides of the opening position of the first through-hole, it is not required that the first through-hole is first filled, then a metal component is disposed on a filler of the first through-hole, and then the planarization layer is disposed, and it is only required that the first through-hole is filled using a material of the planarization layer disposed at the bending area, to save a working procedure. Because the first metal component and the second metal component disposed on the two sides of the first through-hole are bridged using the third metal component disposed on the planarization layer, the first metal component and the second metal component may be electrically connected.

In order to make the aforementioned content of the present disclosure more comprehensible, preferred embodiments are further described in detail hereinafter with reference to accompanying drawings.

DETAILED DESCRIPTION

Figure 1:
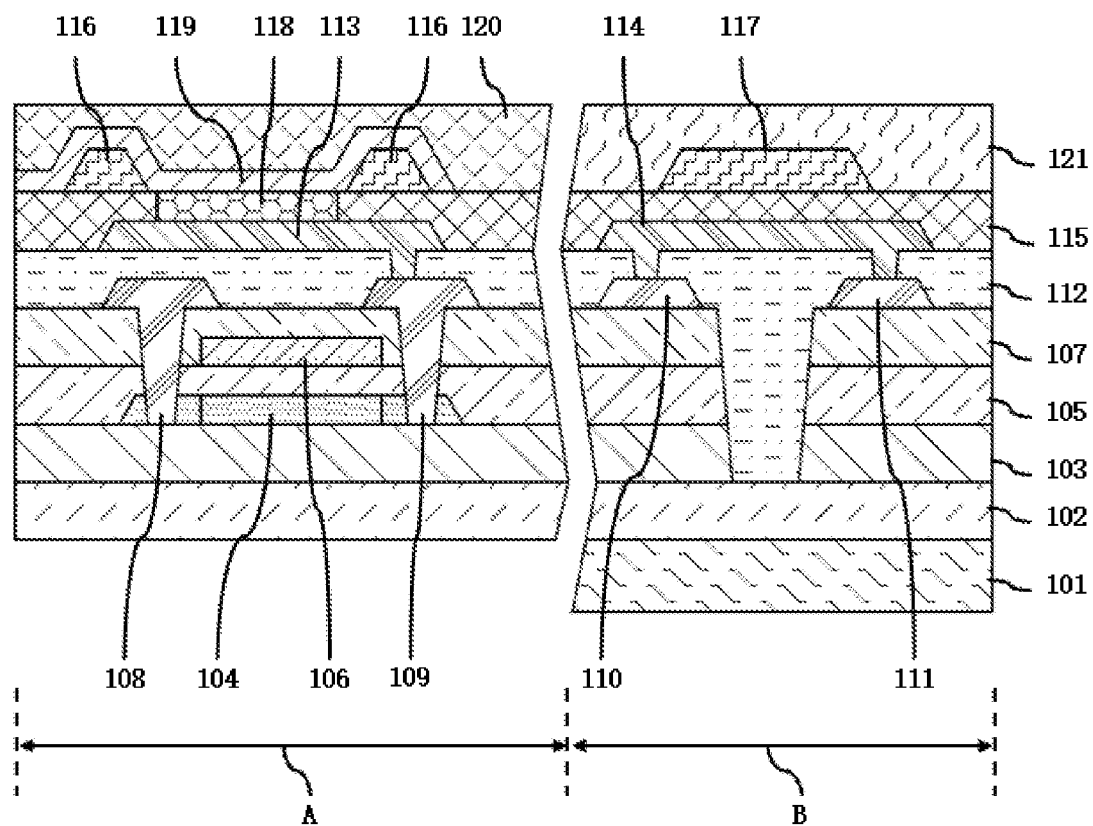
FIG. 1 is a schematic diagram of a first embodiment of a display panel according to the present disclosure.
Figure 2:
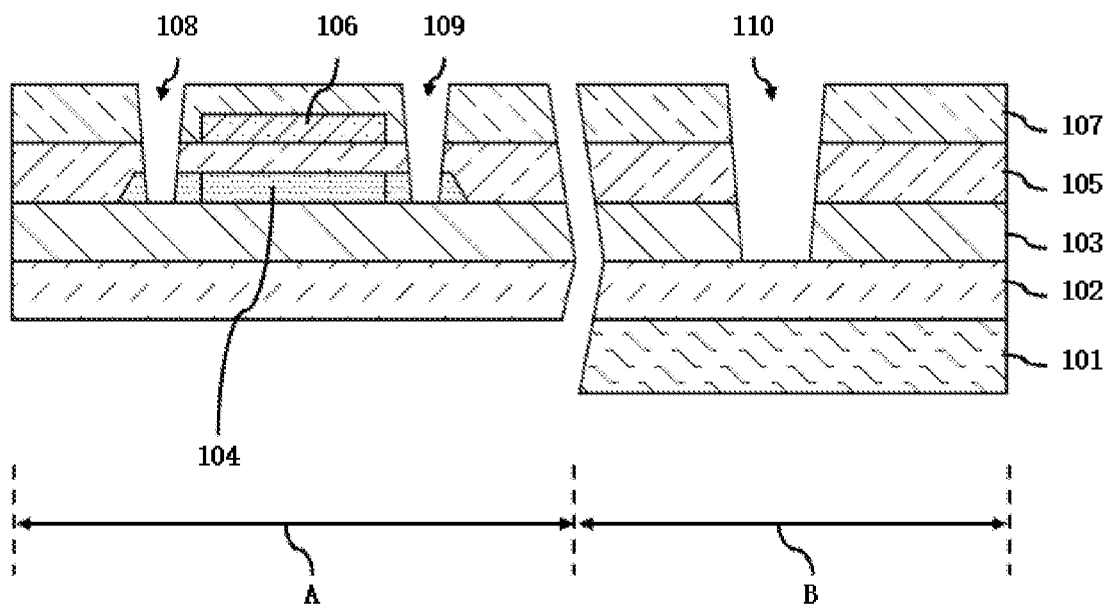
FIG. 2 is a schematic diagram of a manufacturing method of the first embodiment of the display panel according to the present disclosure.
Figure 3:
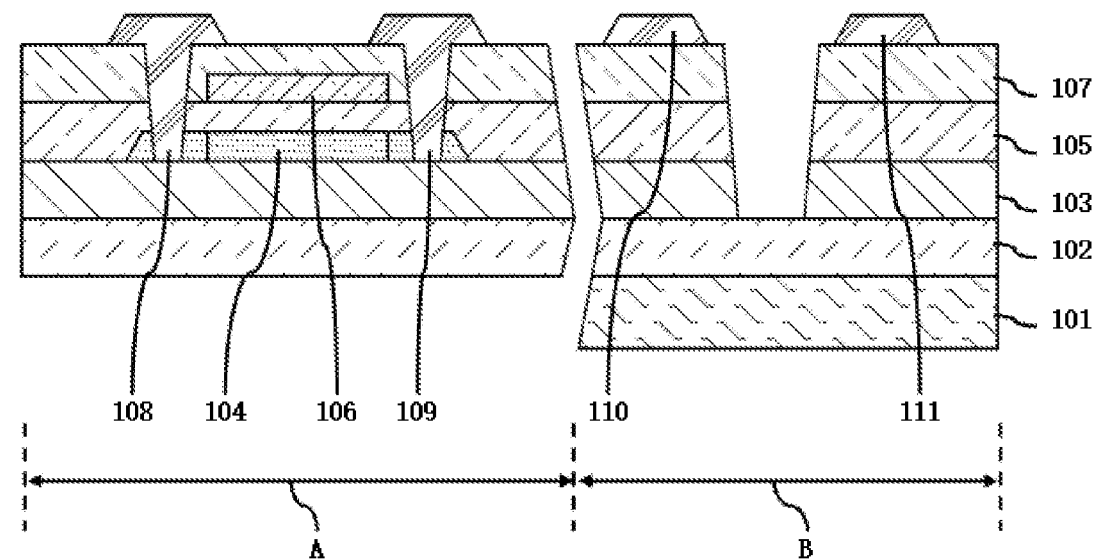
FIG. 3 is a schematic diagram of a manufacturing method of the first embodiment of the display panel according to the present disclosure.
Figure 4:
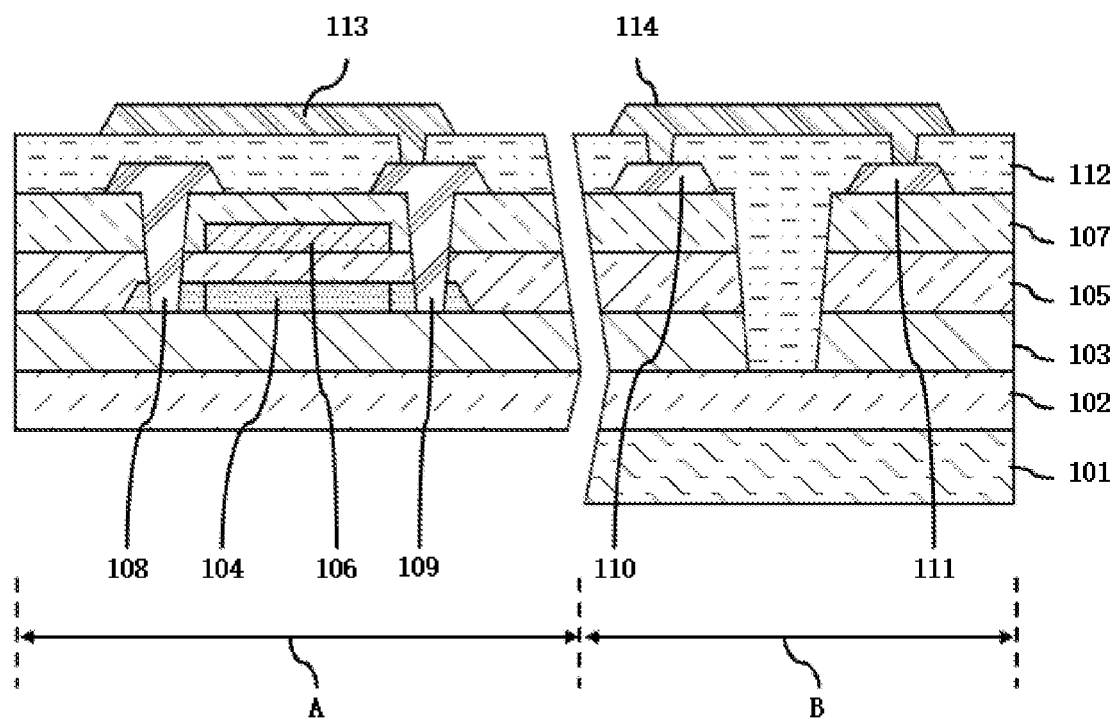
FIG. 4 is a schematic diagram of a manufacturing method of the first embodiment of the display panel according to the present disclosure.
Figure 5:
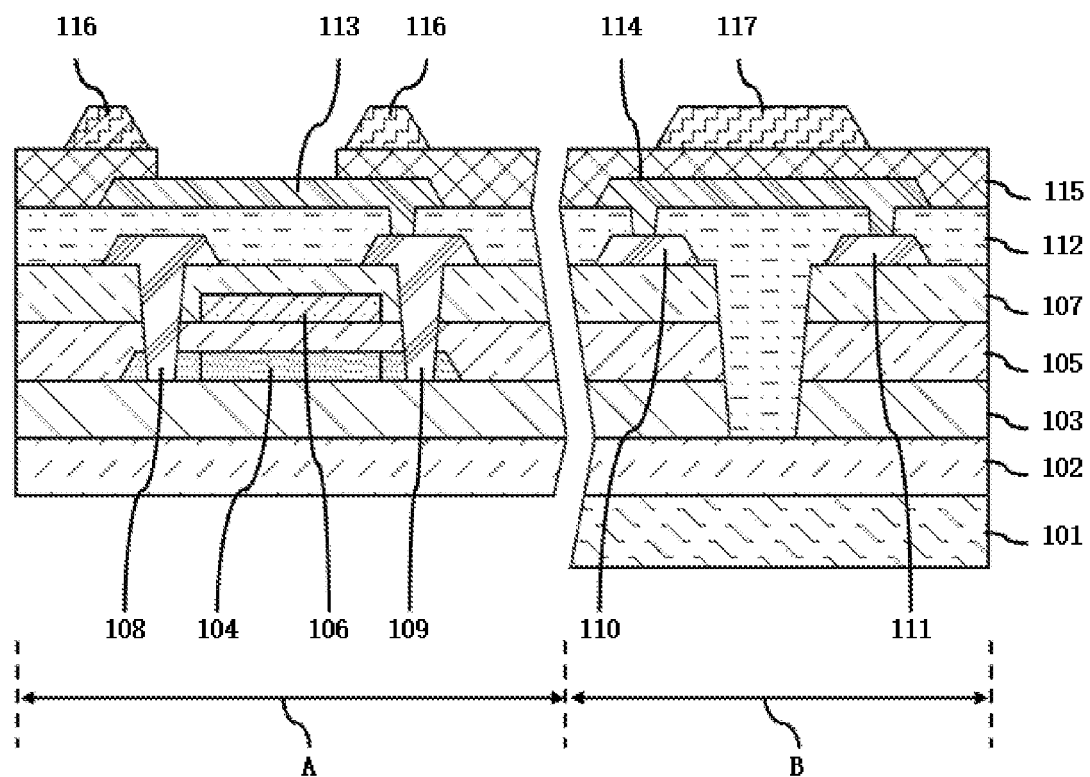
FIG. 5 is a schematic diagram of a manufacturing method of the first embodiment of the display panel according to the present disclosure.
Figure 6:
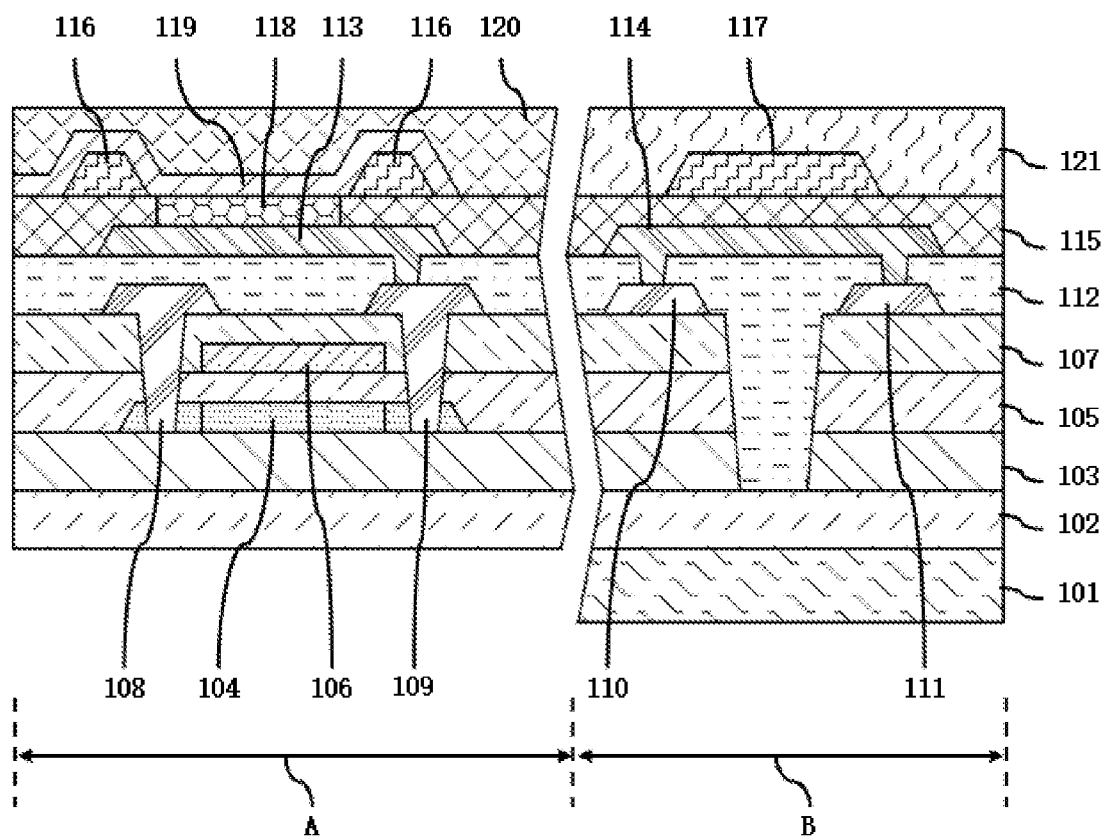
FIG. 6 is a schematic diagram of a manufacturing method of the first embodiment of the display panel according to the present disclosure.

A term "embodiment" used this specification means an example, an instance or an illustration. Moreover, an article "a" used in this specification and appended claims may be generally explained as "one or more", unless otherwise designated or a singular form may be clearly determined from the context.

Referring to FIG. 1 to FIG. 6, FIG. 1 is a schematic diagram of a first embodiment of a display panel according to the present disclosure, and FIG. 2 to FIG. 6 are schematic diagrams of a manufacturing method of the first embodiment of the display panel according to the present disclosure.

The display panel of the present disclosure is applicable to an organic light emitting diode (OLED) display panel.

The display panel of the present disclosure has a display area A and a bending area B, and the display panel includes a flexible film layer 102, a first buffer layer 103, a thin film transistor switching device, an insulation layer, a planarization layer 112, an organic light-emitting diode display device, and a package layer 120.

The first buffer layer 103 is disposed on the flexible film layer 102.

The thin film transistor switching device is disposed on a part of the first buffer layer 103 located at the display area A.

The thin film transistor switching device includes a semiconductor component 104, a gate 106, a source 108, and a drain 109, and the semiconductor component 104 is disposed on the part of the first buffer layer 103 located at the display area A.

The insulation layer includes a first insulation sublayer 105 and a second insulation sublayer 107, the first insulation sublayer 105 is disposed on the semiconductor component 104 and a part of the first buffer layer 103 other than the semiconductor component 104, the gate 106 is disposed on the first insulation sublayer 105, and the second insulation sublayer 107 is disposed on the gate 106 and a part of the first insulation sublayer 105 other than the gate 106.

The gate 106 is formed using forming a first metal layer on the first insulation sublayer 105 and performing a masking process on the first metal layer.

A part of the source 108 and at least one part of the drain 109 are disposed in a fifth through-hole and a sixth through-hole on the insulation layer (the second insulation sublayer 107) that run through the insulation layer.

The fifth through-hole and the sixth through-hole are disposed on a part of the insulation layer located at the display area A.

Further, the fifth through-hole and the sixth through-hole further run through the semiconductor component 104.

A part of the insulation layer located at the bending area B is provided with a first through-hole, and the first through-hole runs through the insulation layer.

The first through-hole, the fifth through-hole, and the sixth through-hole are formed by etching the insulation layer. A depth of the first through-hole in a direction perpendicular to the display panel is greater than depths of the fifth through-hole and the sixth through-hole in the direction perpendicular to the display panel. That is, an etching amount for the first through-hole is greater than an etching amount for the fifth through-hole or an etching amount for the sixth through-hole.

The display panel further includes a first metal component 110, a second metal component 111, and a third metal component 114 that are located at the bending area B, the first metal component 110 and the second metal component 111 are disposed on the insulation layer located at the bending area B (the part of the insulation layer located at the bending area B), and the first metal component 110 and the second metal component 111 are respectively located at locations corresponding to two sides of an opening position of the first through-hole.

The first metal component 110, the second metal component 111, the source 108, and the drain 109 are formed in a same masking process. In details, the source 108, the drain 109, the first metal component 110, and the second metal component 111 are formed by forming a second metal layer on the insulation layer (the second insulation sublayer 107) and performing a masking process on the second metal layer.

The planarization layer 112 is disposed on parts of the insulation layer that are located at the display area A and the bending area B, the planarization layer 112 covers at least one part of the thin film transistor switching device, and a part of the planarization layer 112 located at the bending area B fills the first through-hole.

Locations on the planarization layer 112 that correspond to the first metal component 110 and the second metal component 111 are provided with a second through-hole and a third through-hole, and both the second through-hole and the third through-hole run through the planarization layer. The third metal component 114 is disposed on the part of the planarization layer 112 located at the bending area B and disposed in the second through-hole and the third through-hole, a location of the third metal component 114 corresponds to a location of the first through-hole, and the third metal component 114 is connected to the first metal component 110 and the second metal component 111 using the second through-hole and the third through-hole.

The organic light-emitting diode display device is disposed on the planarization layer partially located at the display area A (a part of the planarization layer located at the display area A).

The organic light-emitting diode display device includes an anode 113, an organic light-emitting layer 118 and a cathode 119, the anode 113 is disposed on the part of the planarization layer 112 located at the display area A and disposed in a fourth through-hole running through the planarization layer 112, the anode 113 is connected to the drain 109 using the fourth through-hole, the organic light-emitting layer 118 is disposed on the anode 113, and at least one part of the cathode 119 is disposed on the organic light-emitting layer 118. The fourth through-hole is provided in the part of the planarization layer 112 located at the display area A.

The package layer 120 is disposed on the organic light-emitting diode display device and a part of a pixel definition layer 115 located at the display area A.

The third metal component 114 and the anode 113 are formed in a same masking process. In details, the anode 113 and the third metal component 114 are formed by forming a third metal layer on the planarization layer 112 and performing a masking process on the third metal layer.

In this embodiment, a material of the flexible film layer 102 is polyimide, resin or the like.

The insulation layer is disposed on parts of the first buffer layer 103 that are located at the display area A and the bending area B, the first through-hole further runs through the first buffer layer 103, and a bottom of the first through-hole extends onto the flexible film layer 102 or into the flexible film layer 102, that is, the bottom of the first through-hole extends to a surface or inside of the flexible film layer 102.

The display panel further includes the pixel definition layer 115, a part of the pixel definition layer 115 located at the bending area B is disposed on the third metal component 114 and a part of the planarization layer 112 not covered by the third metal component 114, and the part of the pixel definition layer 115 located at the bending area B and the part of the planarization layer 112 located at the bending area B are used to prevent the third metal component 114 from being broken in a bending process. In details, the third metal component 114 is sandwiched between a first combination including the second insulation sublayer 107, the first insulation sublayer 105, the first buffer layer 103, the flexible film layer 102, and a first protection plate 101 and a second combination including a structure reinforcement component 117, the part of the pixel definition layer 115 located at the bending area B, and a second protection plate 121, and the first combination and the second combination wrap the third metal component 114. When a part of the display panel located at the bending area B is bent, the first combination and the second combination disperse a stress generated because the part of the display panel located at the bending area B is bent, and therefore a stress applied to the third metal component 114 may be reduced or buffered, thereby preventing the third metal component 114 from being broken in a bending process.

A depressed portion is disposed on the part of the pixel definition layer 115 located at the display area A, a location of the depressed portion corresponds to a location of the anode 113, the organic light-emitting layer 118 is disposed in the depressed portion, and the organic light-emitting layer 118 is in contact with the anode 113. The depressed portion is used to limit a location of the organic light-emitting layer 118.

The display panel of this embodiment further includes a plurality of blocking components 116, and the blocking components 116 are disposed on the part of the pixel definition layer 115 located at the display area A. In details, the blocking components 116 are located at locations on the pixel definition layer 115 that correspond to two sides of the depressed portion.

At least one part of the cathode 119 is further disposed on the blocking components 116.

The structure reinforcement component 117 is disposed on the part of the pixel definition layer 115 located at the bending area B, a location of the structure reinforcement component 117 corresponds to a location of the third metal component 114 and/or a location of the first through-hole, and the structure reinforcement component 117 is used to reinforce a structural strength of the display panel at the bending area B.

A material of the structure reinforcement component 117 is same as a material of the blocking components 116, and the structure reinforcement component 117 and the blocking components 116 are formed in a same masking process.

The package layer 120 is disposed on parts of the pixel definition layer 115 that are located at the display area A and the bending area B. In details, the package layer 120 is disposed on the cathode 119, the structure reinforcement component 117 and a part of the planarization layer 112 other than the cathode 119 and the structure reinforcement component 117.

The first through-hole and a material of the planarization layer 112 filling the first through-hole are used to improve the bending capability of the display panel at the bending area B.

The part of the display panel located at the bending area B is further provided with the first protection plate 101 and the second protection plate 121, the first protection plate 101 and the second protection plate 121 are respectively disposed on two opposite surfaces of the part of the display panel located at the bending area B, the first protection plate 101 is disposed on a surface of the flexible film layer 102 away from the insulation layer, and the second protection plate 121 is disposed on the structure reinforcement component 117 and a surface of the pixel definition layer 115 not covered by the structure reinforcement component 117.

The first protection plate 101 and the second protection plate 121 are used to improve the bending capability of the part of the display panel located at the bending area B, to prevent the part of the display panel located at the bending area B from being broken.

Figure 7:
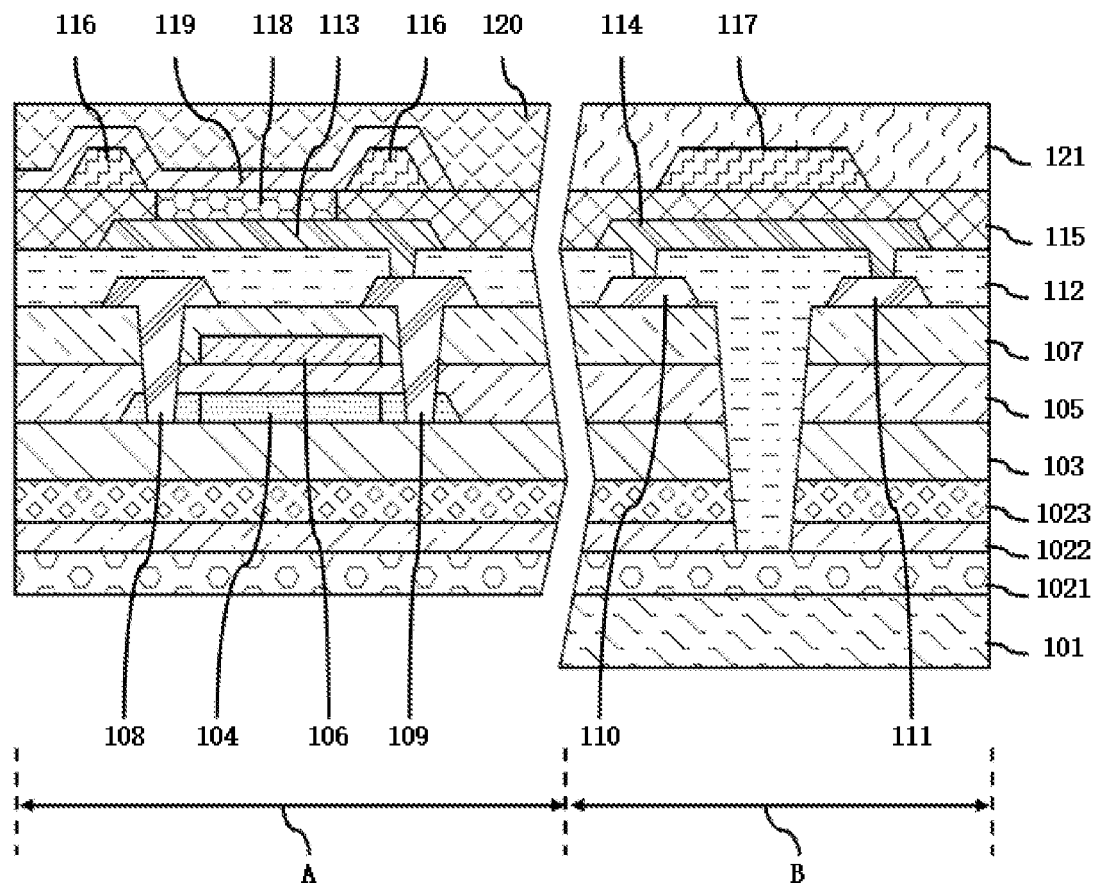
FIG. 7 is a schematic diagram of a second embodiment of a display panel according to the present disclosure.

Referring to FIG. 7, FIG. 7 is a schematic diagram of a second embodiment of a display panel according to the present disclosure. This embodiment is similar to the foregoing first embodiment, and a difference is as follows:

The flexible film layer 102 includes a first film sublayer 1021, a second buffer layer 1022 and a second film sublayer 1023, and the second buffer layer 1022 is disposed between the first film sublayer 1021 and the second film sublayer 1023.

The first through-hole further runs through the second film sublayer 1023, that is, the bottom of the first through-hole extends into the second film sublayer 1023; or the first through-hole further runs through the second film sublayer 1023 and the second buffer layer 1022, that is, the bottom of the first through-hole extends into the second buffer layer 1022.

Figure 8:
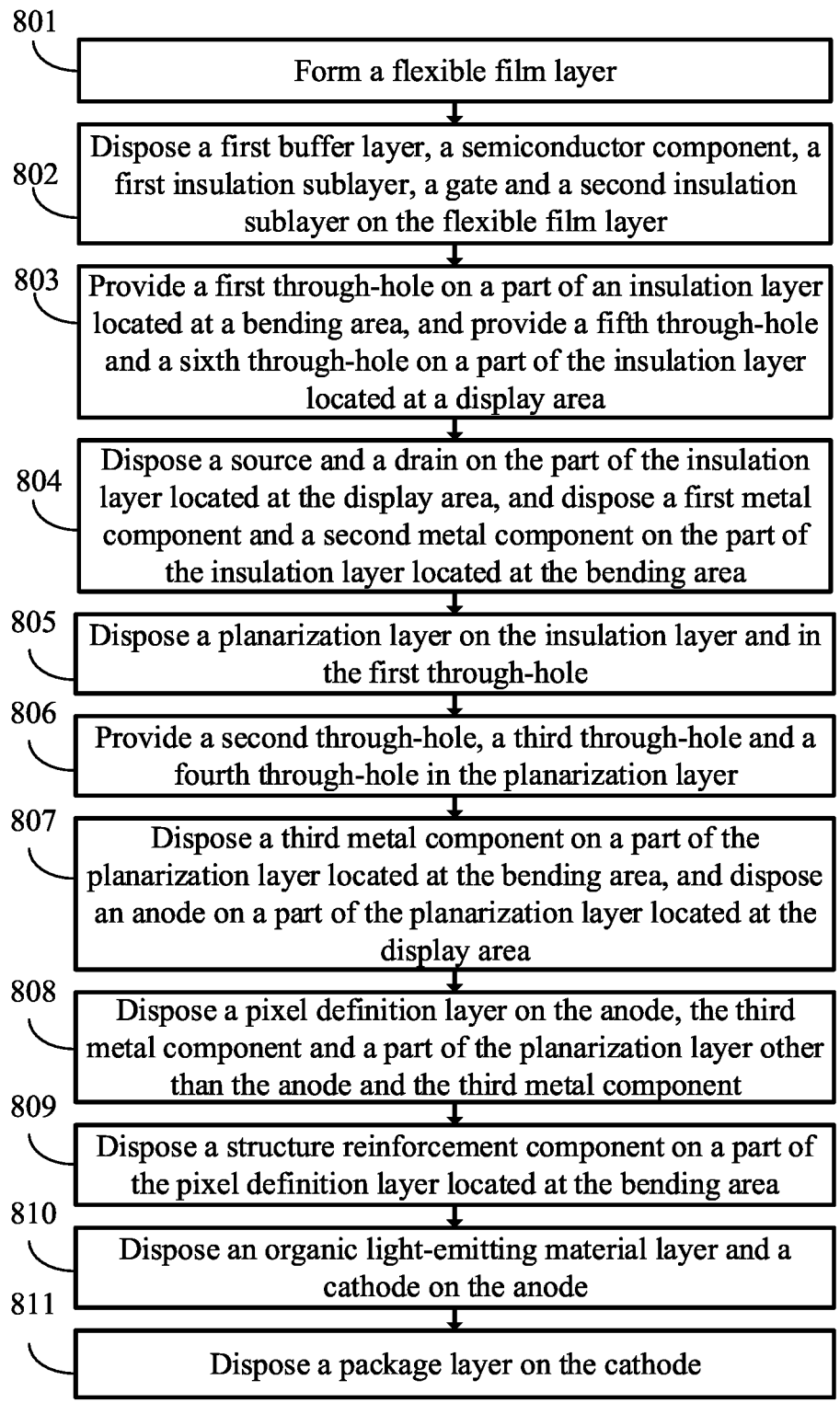
FIG. 8 is a flowchart of a method for manufacturing a display panel according to the present disclosure.

Referring to FIG. 2 to FIG. 6 and FIG. 8, FIG. 2 to FIG. 6 are schematic diagrams of a manufacturing method of the first embodiment of the display panel according to the present disclosure, and FIG. 8 is a flowchart of a method for manufacturing a display panel according to the present disclosure.

The method for manufacturing a display panel of the present disclosure includes the following steps:

Step A (801): Form a flexible film layer 102.

Step B (802): Dispose a first buffer layer 103, a semiconductor component 104, a first insulation sublayer 105, a gate 106 and a second insulation sublayer 107 on the flexible film layer 102, where the first insulation sublayer 105 and the second insulation sublayer 107 form an insulation layer.

In details, the step B includes:

Step b1: Dispose the semiconductor component 104 on the first buffer layer 103.

Step b2: Dispose the first insulation sublayer 105 on the semiconductor component 104 and a part of the first buffer layer 103 other than the semiconductor component 104.

Step b3: Dispose a first metal layer on the first insulation sublayer 105, and perform a masking process on the first metal layer, so as to form the gate 106.

Step b4: Dispose the second insulation sublayer 107 on the gate 106 and a part of the first insulation sublayer 105 other than the gate 106.

Step C (803): Provide a first through-hole on a part that is of the insulation layer including the first insulation sublayer 105 and the second insulation sublayer 107 and that is located at the bending area B, and provide a fifth through-hole and a sixth through-hole on a part of the insulation layer located at the display area A.

In details, the step C is as follows:

Etch the part of the insulation layer located at the bending area B and the part of the insulation layer located at the display area A, so as to form the first through-hole, the fifth through-hole and the sixth through-hole.

All of the first through-hole, the fifth through-hole and the sixth through-hole run through the insulation layer, and a depth of the first through-hole in a direction perpendicular to the display panel is greater than depths of the fifth through-hole and the sixth through-hole in the direction perpendicular to the display panel. That is, an etching amount for the first through-hole is greater than an etching amount for the fifth through-hole or an etching amount for the sixth through-hole.

Further, the fifth through-hole and the sixth through-hole further run through the semiconductor component 104.

Step D (804): Dispose a source 108 and a drain 109 on the part of the insulation layer located at the display area A and in the fifth through-hole and the sixth through-hole, and dispose a first metal component 110 and a second metal component 111 on the part of the insulation layer located at the bending area B.

In details, the step D is as follows:

Dispose a second metal layer on parts of the insulation layer (the second insulation sublayer 107) that are located at the display area A and the bending area B and in the fifth through-hole and the sixth through-hole, and perform a masking process on the second metal layer, so as to form the source 108, the drain 109, the first metal component 110 and the second metal component 111.

Step E (805): Dispose a planarization layer 112 on the insulation layer and in the first through-hole. The planarization layer 112 is disposed on parts of the insulation layer that are located at the display area A and the bending area B, the planarization layer 112 covers at least one part of the thin film transistor switching device, and a part of the planarization layer 112 located at the bending area B fills the first through-hole.

The first through-hole and a material of the planarization layer 112 filling the first through-hole are used to improve the bending capability of the display panel at the bending area B.

Step F (806): Provide a second through-hole, a third through-hole and a fourth through-hole in the planarization layer 112.

In details, the step F is as follows:

Etch parts of the planarization layer 112 that correspond to the first metal component 110, the second metal component 111 and the drain 109, so as to form the second through-hole, the third through-hole and the fourth through-hole.

The first metal component 110 and the second metal component 111 are respectively located at locations corresponding to two sides of an opening position of the first through-hole.

Both the second through-hole and the third through-hole run through the planarization layer 112.

Step G (807): Dispose a third metal component 114 on a part of the planarization layer 112 located at the bending area B and in the second through-hole and the third through-hole, and dispose an anode 113 on a part of the planarization layer 112 located at the display area A and in the fourth through-hole.

A location of the third metal component 114 corresponds to a location of the first through-hole.

In details, the step G (807) is as follows:

Dispose a third metal layer on parts of the planarization layer 112 that are located at the display area A and the bending area B and in the second through-hole, the third through-hole, and the fourth through-hole, and perform a masking process on the third metal layer, so as to form the third metal component 114 and the anode 113.

Step H (810): Dispose an organic light-emitting material layer and a cathode 119 on the anode. The organic light-emitting layer 118 is disposed on the anode 113, and at least one part of the cathode 119 is disposed on the organic light-emitting layer 118.

Step I (811): Dispose a package layer 120 on the cathode 119.

The insulation layer (the first insulation sublayer 105) is disposed on parts of the first buffer layer 103 that are located at the display area A and the bending area B, the first through-hole runs through the insulation layer and the first buffer layer 103, and the bottom of the first through-hole extends into the flexible film layer 102.

The step A includes the following steps:

Step a1: Form a first film sublayer 1021.

Step a2: Dispose a second buffer layer 1022 on the first film sublayer 1021.

Step a3: Dispose a second film sublayer 1023 on the second buffer layer 1022.

The first through-hole further runs through the second film sublayer, or the first through-hole further runs through the second film sublayer 1023 and the second buffer layer 1022, that is, the bottom of the first through-hole extends into the second buffer layer 1022.

After the step G (807), the method for manufacturing a display panel further includes the following step:

Step J (808): Dispose a pixel definition layer 115 on the anode 113, the third metal component 114 and a part of the planarization layer 112 other than the anode 113 and the third metal component 114.

A part of the pixel definition layer 115 located at the bending area B is disposed on the third metal component 114 and a part of the planarization layer 112 not covered by the third metal component 114, and the part of the pixel definition layer 115 located at the bending area B and the part of the planarization layer 112 located at the bending area B are used to prevent the third metal component 114 from being broken in a bending process.

The method for manufacturing a display panel includes the following steps:

Step K (809): Dispose a structure reinforcement component 117 on the part of the pixel definition layer 115 located at the bending area B.

A location of the structure reinforcement component 117 corresponds to a location of the third metal component 114 and/or a location of the first through-hole, and the structure reinforcement component 117 is used to reinforce a structural strength of the display panel at the bending area B.

After the step J (808), the method for manufacturing a display panel includes the following step:

Step L: Dispose a depressed portion on a part of the pixel definition layer 115 located at the display area A, where a location of the depressed portion corresponds to a location of the anode 113.

The organic light-emitting layer 118 is disposed in the depressed portion, and the organic light-emitting layer 118 is in contact with the anode 113. The depressed portion is used to limit a location of the organic light-emitting layer 118.

The display panel of this embodiment further includes a plurality of blocking components 116, and the blocking components 116 are disposed on the part of the pixel definition layer 115 located at the display area A. In details, the blocking components 116 are located at locations on the pixel definition layer 115 that correspond to two sides of the depressed portion. The blocking components 116 and the structure reinforcement component 117 are formed by disposing an organic material layer or an inorganic material layer on parts of the pixel definition layer 115 that are located at the display area A and the bending area B and performing a masking process on the organic material layer or the inorganic material layer.

At least one part of the cathode 119 is further disposed on the blocking components 116.

The step I (811) is as follows:

Dispose the package layer 120 on the cathode 119, the structure reinforcement component 117 and a part of the planarization layer 112 other than the cathode 119 and the structure reinforcement component 117.

In the embodiment of the present disclosure, because the bending area B of the display panel is provided with the first through-hole running through the insulation layer, and at least one part of the planarization layer 112 fills the first through-hole, the technical solutions of the embodiment the present disclosure can improve the bending capability of the display panel. Moreover, because the first metal component 110 and the second metal component 111 are respectively disposed on the two sides of the opening position of the first through-hole, it is not required that the first through-hole is first filled, then a metal component is disposed on a filler of the first through-hole, and then the planarization layer 112 is disposed, and it is only required that the first through-hole is filled using a material of the planarization layer 112 disposed at the bending area B, to save a working procedure. Because the first metal component 110 and the second metal component 111 disposed on the two sides of the first through-hole are bridged using the third metal component 114 disposed on the planarization layer 112, the first metal component 110 and the second metal component 111 may be electrically connected.

To sum up, although the present disclosure is disclosed above using preferred embodiments, the foregoing preferred embodiments are not used to limit the present disclosure. A person of ordinary skill in the art may make various alternations and modifications without departing from the spirit and scope of the present disclosure. Therefore, the protection scope of the present disclosure is subject to the scope defined by claims.

The invention claimed is:

1. A display panel, wherein the display panel has a display area and a bending area, and the display panel comprises:
   a flexible film layer;
   a thin film transistor switching device;
   an insulation layer, wherein a part of the insulation layer located at the bending area is provided with a first through-hole, and the first through-hole runs through the insulation layer;
   a planarization layer, wherein a part of the planarization layer located at the bending area fills the first through-hole;
   an organic light-emitting diode display device, wherein the organic light-emitting diode display device is disposed on the planarization layer partially located at the display area; and
   a package layer;
   wherein the display panel further comprises a first metal component, a second metal component, and a third metal component that are located at the bending area, the first metal component and the second metal component are disposed on the insulation layer located at the bending area, and the third metal component is connected to the first metal component and the second metal component using a second through-hole and a third through-hole;
   wherein the display panel further comprises a first buffer layer, and the first buffer layer is disposed on the flexible film layer;
   wherein the first through-hole further runs through the first buffer layer, and a bottom of the first through-hole extends onto the flexible film layer or into the flexible film layer;
   wherein the third metal component is disposed on the part of the planarization layer located at the bending area, and a location of the third metal component corresponds to a location of the first through-hole; and
   wherein the first metal component and the second metal component are respectively located at locations corresponding to two sides of an opening position of the first through-hole;
   wherein the first metal component, the second metal component, the third metal component, the second through-hole, and the third through-hole are all arranged in the bending area and are all arranged outside the display area;
   wherein the third metal component is sandwiched between a first combination comprising a first insulation sublayer, a first insulation sublayer, the first buffer layer, the flexible film layer, and a first protection plate and a second combination comprising a structure reinforcement component, a part of a pixel definition layer located at the bending area, and a second protection plate, and the first combination and the second combination wrap the third metal component;
   wherein when a part of the display panel located at the bending area is bent, the first combination and the second combination disperse a stress generated because the part of the display panel located at the bending area is bent.

2. The display panel according to claim 1, wherein the flexible film layer comprises a first film sublayer, a second buffer layer, and a second film sublayer, and the second buffer layer is disposed between the first film sublayer and the second film sublayer; and
   the first through-hole further runs through the second film sublayer, or the first through-hole further runs through the second film sublayer and the second buffer layer.

3. A display panel, wherein the display panel has a display area and a bending area, and the display panel comprises:
   a flexible film layer;
   a thin film transistor switching device;
   an insulation layer, wherein a part of the insulation layer located at the bending area is provided with a first through-hole, and the first through-hole runs through the insulation layer;
   a planarization layer, wherein a part of the planarization layer located at the bending area fills the first through-hole;
   an organic light-emitting diode display device, wherein the organic light-emitting diode display device is disposed on the planarization layer partially located at the display area; and
   a package layer;

wherein the display panel further comprises a first metal component, a second metal component, and a third metal component that are located at the bending area, the first metal component and the second metal component are disposed on the insulation layer located at the bending area, and the third metal component is connected to the first metal component and the second metal component using a second through-hole and a third through-hole;

wherein the first metal component, the second metal component, the third metal component, the second through-hole, and the third through-hole are all arranged in the bending area and are all arranged outside the display area;

wherein the third metal component is sandwiched between a first combination comprising a first insulation sublayer, a first insulation sublayer, the first buffer layer, the flexible film layer, and a first protection plate and a second combination comprising a structure reinforcement component, a part of a pixel definition layer located at the bending area, and a second protection plate, and the first combination and the second combination wrap the third metal component;

wherein when a part of the display panel located at the bending area is bent, the first combination and the second combination disperse a stress generated because the part of the display panel located at the bending area is bent.

4. The display panel according to claim 3, wherein the display panel further comprises a first buffer layer, and the first buffer layer is disposed on the flexible film layer; and
the first through-hole further runs through the first buffer layer, and a bottom of the first through-hole extends onto the flexible film layer or into the flexible film layer.

5. The display panel according to claim 4, wherein the flexible film layer comprises a first film sublayer, a second buffer layer, and a second film sublayer, and the second buffer layer is disposed between the first film sublayer and the second film sublayer; and
the first through-hole further runs through the second film sublayer, or the first through-hole further runs through the second film sublayer and the second buffer layer.

6. The display panel according to claim 3, wherein the third metal component is disposed on the part of the planarization layer located at the bending area, and a location of the third metal component corresponds to a location of the first through-hole.

7. The display panel according to claim 6, wherein the display panel further comprises the pixel definition layer, the part of the pixel definition layer located at the bending area is disposed on the third metal component and a part of the planarization layer not covered by the third metal component, and the part of the pixel definition layer located at the bending area and the part of the planarization layer located at the bending area are used to prevent the third metal component from being broken in a bending process.

8. The display panel according to claim 7, further comprising the structure reinforcement component disposed on the part of the pixel definition layer located at the bending area, wherein a location of the structure reinforcement component corresponds to a location of the third metal component and/or a location of the first through-hole, and the structure reinforcement component is used to reinforce a structural strength of the display panel at the bending area.

9. The display panel according to claim 8, further comprising a plurality of blocking components disposed on a part of the pixel definition layer located at the display area, and wherein a material of the structure reinforcement component is same as a material of the blocking components.

10. The display panel according to claim 3, wherein the first metal component and the second metal component are respectively located at locations corresponding to two sides of an opening position of the first through-hole; and
the second through-hole and the third through-hole run through the planarization layer.

11. The display panel according to claim 3, wherein a part of the insulation layer located at the display area is provided with a fifth through-hole and a sixth through-hole; and
a depth of the first through-hole in a direction perpendicular to the display panel is greater than depths of the fifth through-hole and the sixth through-hole in the direction perpendicular to the display panel.

12. The display panel according to claim 8, wherein a part of the display panel located at the bending area is further provided with the first protection plate and the second protection plate, the first protection plate is disposed on a surface of the flexible film layer away from the insulation layer, and the second protection plate is disposed on the structure reinforcement component and a surface of the pixel definition layer that is not covered by the structure reinforcement component.

13. A method for manufacturing a display panel, wherein the method for manufacturing a display panel comprises the following steps:
step A: forming a flexible film layer;
step B: disposing a first buffer layer, a semiconductor component, an insulation layer, and a gate on the flexible film layer;
step C: providing a first through-hole on a part of the insulation layer located at a bending area of the display panel, and providing a fifth through-hole and a sixth through-hole on a part of the insulation layer located at a display area of the display panel;
step D: disposing a source and a drain on the part of the insulation layer located at the display area and in the fifth through-hole and the sixth through-hole, and forming a first metal component and a second metal component on the part of the insulation layer located at the bending area;
step E: forming a planarization layer on the insulation layer and in the first through-hole;
step F: providing a second through-hole, a third through-hole, and a fourth through-hole in the planarization layer;
step G: disposing a third metal component on a part of the planarization layer located at the bending area and in the second through-hole and the third through-hole, and disposing an anode on a part of the planarization layer located at the display area and in the fourth through-hole;
step H: disposing an organic light-emitting material layer and a cathode on the anode; and
step I: disposing a package layer on the cathode;
wherein the first metal component, the second metal component, the third metal component, the second through-hole, and the third through-hole are all arranged in the bending area and are all arranged outside the display area;
wherein the third metal component is sandwiched between a first combination comprising a first insulation sublayer, a first insulation sublayer, the first buffer layer, the flexible film layer, and a first protection plate and a second combination comprising a structure reinforcement component, a part of a pixel definition layer located at the bending area, and a second protection plate, and the first combination and the second combination wrap the third metal component;

wherein when a part of the display panel located at the bending area is bent, the first combination and the second combination disperse a stress generated because the part of the display panel located at the bending area is bent.

14. The method for manufacturing a display panel according to claim 13, wherein the first through-hole runs through the insulation layer and the first buffer layer, and a bottom of the first through-hole extends into the flexible film layer.

15. The method for manufacturing a display panel according to claim 14, wherein the step A comprises:
   step a1: forming a first film sublayer;
   step a2: disposing a second buffer layer on the first film sublayer; and
   step a3: disposing a second film sublayer on the second buffer layer, wherein the first through-hole further runs through the second film sublayer, or the first through-hole further runs through the second film sublayer and the second buffer layer.

16. The method for manufacturing a display panel according to claim 13, wherein a location of the third metal component corresponds to a location of the first through-hole.

17. The method for manufacturing a display panel according to claim 13, wherein after the step G, the method for manufacturing a display panel further comprises the following step:
   step J: disposing the pixel definition layer on the anode, the third metal component, and a part of the planarization layer other than the anode and the third metal component,
   wherein the part of the pixel definition layer located at the bending area is disposed on the third metal component and a part of the planarization layer not covered by the third metal component, and the part of the pixel definition layer located at the bending area and the part of the planarization layer located at the bending area are used to prevent the third metal component from being broken in a bending process.

18. The method for manufacturing a display panel according to claim 17, wherein the method for manufacturing a display panel comprises the following step:
   step K: disposing the structure reinforcement component on the part of the pixel definition layer located at the bending area,
   wherein a location of the structure reinforcement component corresponds to a location of the third metal component and/or a location of the first through-hole, and the structure reinforcement component is used to reinforce a structural strength of the display panel at the bending area.

19. The method for manufacturing a display panel according to claim 13, wherein the first metal component and the second metal component are respectively located at locations corresponding to two sides of an opening position of the first through-hole; and
   the second through-hole and the third through-hole run through the planarization layer.

20. The method for manufacturing a display panel according to claim 13, wherein a depth of the first through-hole in a direction perpendicular to the display panel is greater than depths of the fifth through-hole and the sixth through-hole in the direction perpendicular to the display panel.

* * * * *